(12) United States Patent
Danielsons

(10) Patent No.: US 6,242,978 B1
(45) Date of Patent: Jun. 5, 2001

(54) METHOD AND APPARATUS FOR LINEARIZING AN AMPLIFIER

(75) Inventor: David Christopher Danielsons, Hannibal, MO (US)

(73) Assignee: Harris Corporation, Melbourne, FL (US)

(*) Notice: Subject to any disclaimer, the term of this patent is extended or adjusted under 35 U.S.C. 154(b) by 0 days.

(21) Appl. No.: 09/343,340

(22) Filed: Jun. 30, 1999

(51) Int. Cl.[7] .................................................. H03F 1/32
(52) U.S. Cl. ................................................ 330/149
(58) Field of Search .................. 330/149, 151; 375/296, 297

(56) References Cited

U.S. PATENT DOCUMENTS

| | | | |
|---|---|---|---|
| 4,453,133 | 6/1984 | Travis | 330/149 |
| 5,258,722 | * 11/1993 | Jeffers | 330/149 |
| 5,621,354 | 4/1997 | Mitzlaff | 330/52 |
| 5,781,069 | 7/1998 | Baskin | 330/149 |
| 5,850,162 | 12/1998 | Danielsons | 330/149 |

FOREIGN PATENT DOCUMENTS

0367458 A2   5/1990   (EP) .

OTHER PUBLICATIONS

PCT International Search Report Dated Oct. 30, 2000 (3 pgs.) for PCT/US00/18101.

* cited by examiner

*Primary Examiner*—Steven J. Mottola
(74) *Attorney, Agent, or Firm*—Tarolli, Sundheim, Covell, Tummino & Szabo L.L.P.

(57) ABSTRACT

Apparatus and method are provided for linearizing a first amplifier having a non-linear signal response characteristic to an applied input signal wherein the amplifier is located between a signal source and a load. This is accomplished by selecting a second amplifier that exhibits a non-linear signal response characteristic to an applied input signal similar to that of the first amplifier. A portion of the input signal obtained from the signal source is then applied to the second amplifier to generate an output signal. A determination is made as to whether there is any difference between the input signal and the output signal and a difference signal is provided in accordance therewith. The difference signal is phase inverted to obtain an inverted difference signal. This inverted difference signal is combined with the input signal to provide a corrected input signal. The corrected input signal is applied to the first amplifier to obtain a corrected output signal therefrom.

41 Claims, 2 Drawing Sheets

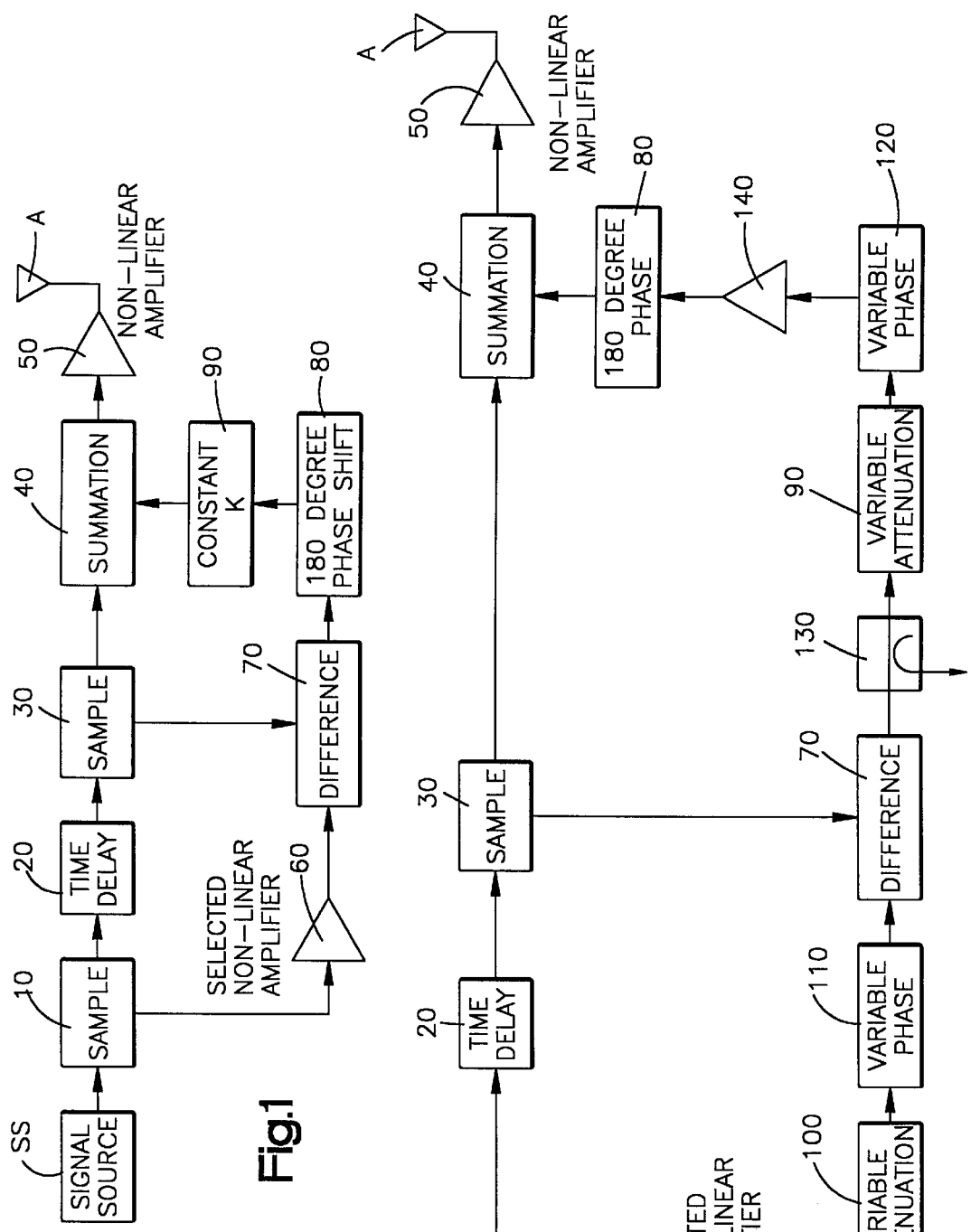

METHOD AND APPARATUS FOR LINEARIZING AN AMPLIFIER

BACKGROUND OF THE INVENTION

Spectral re-growth due to an amplifier's non-linear distortion characteristics has become an important issue in modern amplifier design. With the increased demand for channel allocations, closer channel spacing and new modulation techniques with their higher peak to average power ratios comes an increased demand for amplifiers exhibiting extremely high linearity. Class A amplifiers exhibit good linearity but they suffer from poor efficiency and high cost when high power levels are required. Class A/B amplifiers are more cost effective but suffer from poor linearity. Methods of correction exist which can improve an amplifier's linearity. Pre-correction with linearizers will improve an amplifier's linearity, but since such linearizers are open-loop they exhibit stability problems with time and temperature. Feedforward correction of an amplifier will improve the amplifier's linearity, but this type of correction requires a higher power amplifier due to losses inherent with the feedforward correction. Feedback correction will improve an amplifier's linearity, but these are usually band width limited.

A feedforward system in the prior art of interest takes the form of the U.S. Pat. No. to D. Danielsons 5,850,162. In that system, an output amplifier having a non-linear signal response characteristic is linearized by selecting a preceding amplifier in a multi-stage amplifier network and providing feedforward overcorrection to the preceding amplifier to compensate for the non-linear signal response characteristics of the output amplifier.

It is contemplated that an amplifier having non-linear response characteristic can be linearized with a corrected input signal obtained from another amplifier which has been selected as exhibiting similar non-linear characteristics as the amplifier to be corrected. Also, it is contemplated that practicing the invention will result in efficiencies rivaling that of a Class A/B amplifier while yielding linearity that exceeds that of a Class A amplifier with wide bandwidth operation.

It is further contemplated that the invention herein may reduce the memory-full and/or non-memory-full distortions of an amplifier having a non-linear signal characteristic. Memory-full distortions refer to time dependent or historic distortions whereas non-memory-full distortions refer to non-time dependent distortions.

SUMMARY OF THE INVENTION

In accordance with one aspect of the present invention, apparatus and method are provided for linearizing a first amplifier having a non-linear signal response characteristic to an input signal wherein the amplifier is located between a signal source and a load. This is accomplished by selecting a second amplifier that exhibits a non-linear signal response characteristic similar to that of the first amplifier. A first portion of the input signal obtained from the signal source is applied to the second amplifier to generate an output signal. A determination is made as to whether there is any difference between a second portion of the input signal and the output signal and a difference signal is provided in accordance therewith. The difference signal is then phase inverted to obtain an inverted difference signal. This inverted difference signal is combined with the second portion of the input signal to provide a corrected input signal. The corrected input signal is applied to the first amplifier to obtain a corrected output signal therefrom.

In accordance with another aspect of the present invention, the memory-full and/or non-memory-full distortions of an output amplifier having a non-linear signal response characteristic to an applied input signal is reduced by providing a corrected input signal which is a memory-full and/or non-memory-full in an inverse or negative manner. This aspect of the invention is accomplished by selecting an amplifier having similar memory-full and/or non-memory-full distortions as the output amplifier. A portion of the input signal is applied to the selected amplifier, which is a scaled version of the output amplifier, to produce memory-full and/or non-memory-full distortions. These distortions mimic the distortions of the output amplifier. The output of the selected amplifier contains both the amplified version of the input signal and the memory-full and/or non-memory-full distortions of the input signal. A portion of the input signal is subtracted from a portion of the output of the selected amplifier. This difference represents the negative of the memory-full and/or non-memory-full distortions of the selected amplifier. At least a portion of the negative distortions of the selected amplifier are combined with at least a portion of the original input signal. The combined input signal, with the negative distortions of the selected amplifier, is applied to the output amplifier. The resulting output of the output amplifier is essentially distortion free and contains essentially no memory-full and/or non-memory-full distortions.

BRIEF DESCRIPTION OF THE DRAWINGS

The foregoing and other advantages of the invention will become more readily apparent from the following description of the preferred embodiment of the invention as taken in conjunction with the accompanying drawings, which are a part hereof, and wherein:

FIG. 1 is a schematic-block diagram illustration of one embodiment of the present invention;

FIG. 2 is a schematic-block diagram illustration of a second embodiment of the invention herein; and, FIG. 3 is a schematic-block diagram illustration of a third embodiment of the invention herein.

DESCRIPTION OF PREFERRED EMBODIMENTS

Figure 3:
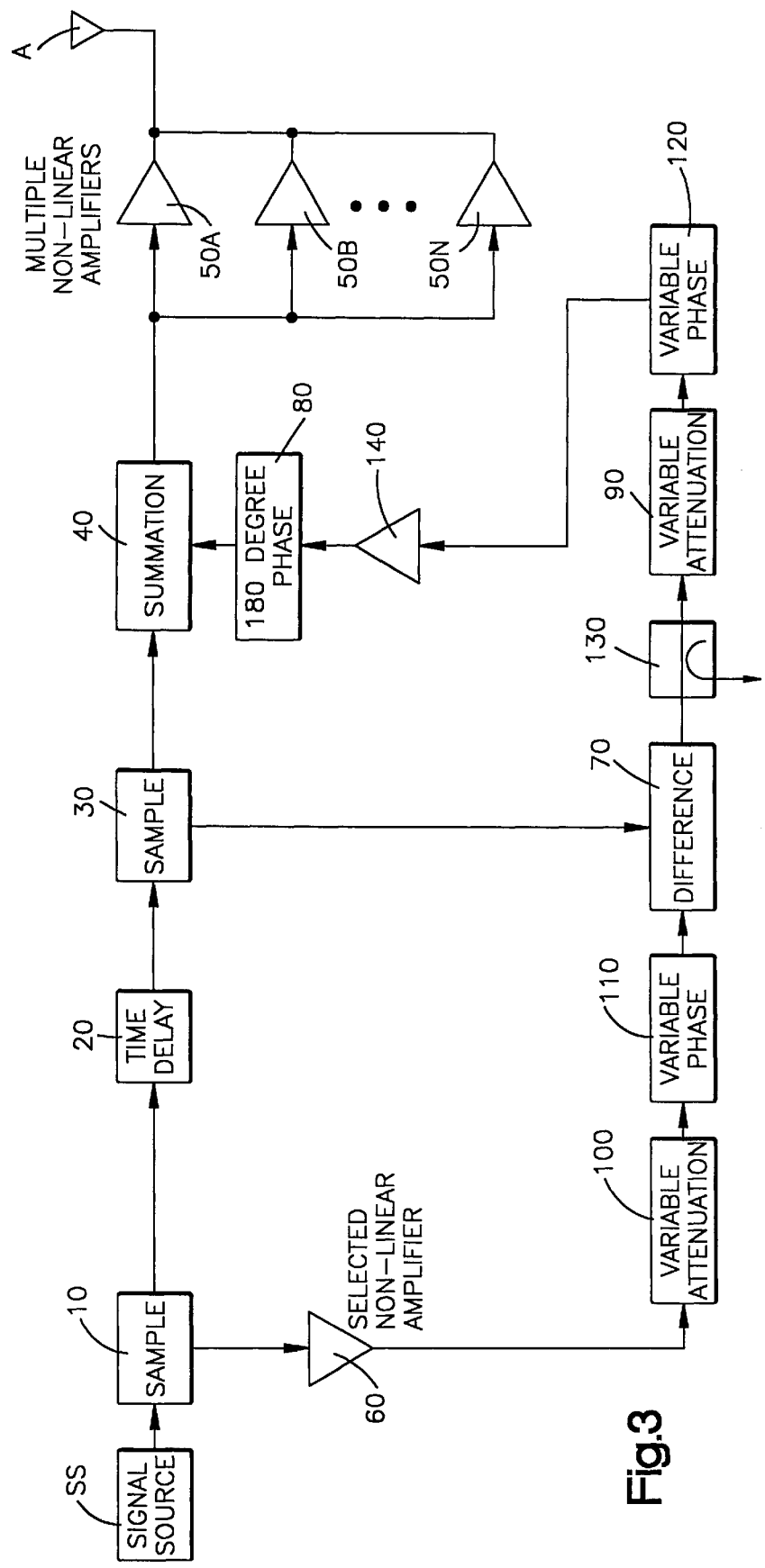

The invention is directed toward linearizing an output amplifier having a non-linear signal response characteristic. The distortions of the amplifier may be memory-full and/or non-memory-full distortions. These distortions are minimized by providing a corrected input signal as will be described in detail hereinafter.

Reference is now made specifically to FIG. 1 which illustrates a non-linear amplifier 50 located intermediate a signal source SS and a load which may take the form of an antenna A. The amplifier 50 may take the form of a power amplifier employed in a radio frequency (RF) broadcasting transmitter. The invention has particular application for use in providing linear amplification in a television transmitter. It is to be noted, however, that the invention herein may be applied to other situations wherein linear amplification is required. Such other situations, may, for example, include single-sideband communication transmitters, cellular radio based station transmitters and microwave transmitters.

In the application being considered herein, the non-linear amplifier 50 normally receives an input signal from the signal source SS and provides an output signal for application to the antenna A. This output signal, because of the non-linear response characteristics of amplifier 50, will include memory-full and/or non-memory-full distortions. This is corrected by apparatus and method as described herein below. A sampling device 10 samples the input signal from the source SS and supplies a portion of the input signal to a time delay 20 and another portion to a selected non-linear amplifier 60. The sampling device itself may be implemented by a zero degree splitter, a directional coupler or other sampling device. The outputs of the sampling device 10 are scaled replications of the input signal obtained from the signal source SS. Thus, one scaled portion is supplied to the time delay 20 whereas a second scaled portion is supplied to the amplifier 60.

The amplifier 60 is selected such that it exhibits a non-linear response characteristic similar to or that mimics that of the non-linear amplifier 50. Thus, this amplifier 60 exhibits either or both memory-full and non-memory-full distortions and generates an output which is larger than its input. The amplifier 60 may be a scaled version of the non-linear amplifier 50. Also, it should be noted that if only memory-full distortions are to be corrected then the selected amplifier 60 need only create memory-full distortions. If only non-memory-full distortions are to be corrected, then amplifier 60 need only create non-memory-full distortions. If both types of distortions are to be corrected, then amplifier 60 should exhibit both memory-full and non-memory-full distortions. Amplifier 60 may run at a much lower power level than the output amplifier 50. If desired, amplifier 60 could be identical to that of the output amplifier 50.

The time delay 20 receives a portion of the original input signal from the sampling device 10 and then delays it by a time duration corresponding to the delay caused by amplifier 60 and supplies this time delayed portion to a sampling device 30. The time delay can be implemented by a coaxial transmission line, a filter or other suitable time delaying means.

The time delayed input signal is applied to a sampling device 30 which operates in the same manner as the sampling device 10. The sampling device 30 provides a signal for application to summation device 40 and a signal for application to a difference circuit 70. The two signals obtained from the sampling device 30 may be at the same or at a reduced level as the input signal to the sampling device 30.

The sample of the input signal from device 30 and the output of the selected non-linear amplifier 60, are supplied to the difference circuit 70 which determines the difference between the two inputs and provides an output difference signal having a value representative of the difference of the two inputs.

The difference output signal is supplied to a 180 degree phase shift circuit 80 which inverts the applied signal. Thus, the output of the phase shift circuit 80 is the negative of the input to that circuit. The output of the phase shift circuit 80 is scaled by a scaling constant K at a scaling circuit 90. The value of K is either one, less than one or greater than one. It should be noted that circuits 80 and 90 may be reversed in their order.

The scaled negative difference signal obtained from circuit 90 is combined with the time delayed portion of the input signal in a summation device 40. The summation or corrected input signal is applied to the non-linear amplifier 50. The summation device 40 may be implemented in the form of a zero degree hybrid, direction coupler or other summing device. Also, the summation device 40 can be implemented in the form of a 180 degree hybrid wherein the phase shift circuit 80 becomes an inherent part of the 180 degree hybrid.

It is within the output amplifier 50 that the negative difference signal, which contains the memory-full and/or non-memory-full distortion replica of the output amplifier, is cancelled. The output of the output amplifier is essentially a distortion free replica of the original input signal.

Reference is now made to FIG. 2 which illustrates a second embodiment of the invention. This embodiment is similar to that of the embodiment in FIG. 1 and to simplify the description herein like components are identified with like character references. Only the differences between the embodiment of FIG. 1 and that of FIG. 2 will be discussed below.

The sampling devices 10 and 30, the time delay device 20 and the selected amplifier 60 have gain and phase variations from the ideal and from one unit to the next. To compensate for these variations, a manually adjustable variable attenuator 100 and a manually adjustable variable phase adjuster 110 have been added to the circuit.

In order to obtain the ideal difference at the output of the difference circuit 70, a probe or sampling device 130 is added. By observation of the signal present at the output of the difference device 70 by sampling device 130, the variable attenuation device 100 and the variable phase adjuster 110 may be set or adjusted so that the original input signal is fully cancelled and the difference device 70 contains only the memory-full and/or the non-memory-full distortions created by the selected amplifier 60.

The summation device 40 and the 180 degree phase device 80 exhibit gain and phase variations from the ideal and from one unit to the next unit. To compensate for these variations, a manually adjustable variable attenuation device 90 and a manually adjustable variable phase adjuster 120 have been added. It is to be further noted that the gain constant K device 90 in FIG. 1 has been replaced in FIG. 2 by the variable attenuation device 90.

Also, in actual practice, the variable attenuation device 90 and the variable phase adjuster 120 have losses not present in the ideal devices. Consequently, a linear amplifier 140 has been added to recover those losses.

Reference is now made to FIG. 3 which illustrates a third embodiment of the invention herein. This embodiment is similar to that illustrated in FIG. 2 and consequently only the differences between the two embodiments are described below.

As discussed earlier herein, the output amplifier 50 may be a single amplifying device or plurality of amplifiers combined in any combining system. The selected amplifier 60 need only have similar memory-full and/or non-memory-full distortions as the total presented by the output amplifier 50. This amplifier 50 may be made up of a group of multiple non-linear amplifiers 50A, 50B, . . . 50N wherein N represents the number of such non-linear amplifiers employed.

Although the invention has been described in conjunction with preferred embodiments, it is to be appreciated that various modifications may be made without departing from the spirit and scope of the invention as defined by the appended claims.

Having described the invention, I claim the following:

1. Apparatus for linearizing a first amplifying means having a non-linear signal response characteristic to an applied input signal and located between a signal source and a load comprising:

second amplifying means selected such as to exhibit a non-linear signal response characteristic to an applied input signal similar to that of said first amplifying means;

means for applying a first portion of said input signal obtained from said signal source to said second amplifying means to generate an output signal therefrom;

means for determining whether there is any difference between a second portion of said input signal and said output signal and providing a difference signal in accordance therewith;

means for phase inverting said difference signal to obtain an inverted difference signal;

means for combining said inverted difference signal with said second portion of said input signal to obtain a corrected input signal;

means for applying said corrected input signal to said first amplifying means to obtain a corrected output signal therefrom;

said means for applying a first portion includes first sampling means; and, second sampling means for applying portions of said input signal to said difference determining means and to said combining means.

2. Apparatus as set forth in claim 1 including means for time delaying said second portion of said input signal for a time duration corresponding with a time delay caused by said second amplifying means.

3. Apparatus as set forth in claim 2 wherein said time delaying means is interposed between said first sampling means and said difference determining means and in parallel relationship with said second amplifying means.

4. Apparatus as set forth in claim 1 including scaling means interposed between said phase inverting means and said combining means for scaling said inverted difference signal.

5. Apparatus as set forth in claim 1 including attenuating means interposed between said second amplifying means and said difference determining means for attenuating said output signal.

6. Apparatus as set forth in claim 5 wherein said attenuating means is adjustable.

7. Apparatus as set forth in claim 6 wherein said adjustable attenuating means is manually adjustable.

8. Apparatus as set forth in claim 1 including phase changing means interposed between said second amplifying means and said difference determining means for changing the phase of said output signal.

9. Apparatus as set forth in claim 8 wherein said phase changing means is adjustable.

10. Apparatus as set forth in claim 9 wherein said adjustable phase changing means is manually adjustable.

11. Apparatus as set forth in claim 1 including attenuating means interposed between said difference determining means and said phase inverting means for attenuating said difference signal.

12. Apparatus as set forth in claim 11 wherein said attenuating means is adjustable.

13. Apparatus as set forth in claim 12 wherein said adjustable attenuating means is manually adjustable.

14. Apparatus as set forth in claim 1 including phase adjusting means interposed between said difference determining means and said phase inverting means for adjusting the phase of said difference signal.

15. Apparatus as set forth in claim 14 wherein said phase adjusting means is adjustable.

16. Apparatus as set forth in claim 15 wherein said phase adjustable means is manually adjustable.

17. Apparatus as set forth in claim 1 including a first variable attenuation means and a first variable phase adjusting means interposed between said second amplifying means and said difference determining means.

18. Apparatus as set forth in claim 17 including second variable attenuation means and second variable phase adjusting means interposed between said difference signal determining means and said phase inverting means.

19. A method of linearizing a first amplifying means having a nonlinear signal response characteristic to an applied input signal and located between a signal source and a load comprising the steps of:

selecting a second amplifying means that exhibits a non-linear signal response characteristic to an applied input signal similar to that of said first amplifying means;

applying a first portion of said input signal obtained from said signal source to said second amplifying means to generate an output signal therefrom;

determining whether there is any difference between a second portion of said input signal and said output signal and providing a difference signal in accordance therewith;

phase inverting said difference signal to obtain an inverted difference signal;

combining said inverted difference signal with said second portion of said input signal to obtain a corrected input signal;

applying said corrected input signal to said first amplifying means to obtain a corrected output signal therefrom;

delaying said second portion of said input signal for a time period corresponding with the time duration of any delay caused by said second amplifying means; and, varying the phase of said output signal from said second amplifying means prior to determining the difference between said output signal and said second portion of said input signal.

20. A method as set forth in claim 19 including the step of varying the magnitude of the output signal from said second amplifying means prior to the step of determining any difference between said output signal and said second portion of said input signal.

21. A method of linearizing a first amplifying means having a non-linear signal response characteristic to an applied input signal and located between a signal source and a load comprising the steps of:

selecting a second amplifying means that exhibits a non-linear signal response characteristic to an applied input signal similar to that of said first amplifying means;

applying a first portion of said input signal obtained from said signal source to said second amplifying means to generate an output signal therefrom;

determining whether there is any difference between a second portion of said input signal and said output signal and providing a difference signal in accordance therewith;

phase inverting said difference signal to obtain an inverted difference signal;

combining said inverted difference signal with said second portion of said input signal to obtain a corrected input signal; and applying said corrected input signal to said first amplifying means to obtain a corrected output signal therefrom;

delaying said second portion of said input signal for a time period corresponding with the time duration of any delay caused by said second amplifying means; and, varying the magnitude of said difference signal prior to the step of inverting said difference signal.

22. A method of linearizing a first amplifying means having a non-linear signal response characteristic to an applied input signal and located between a signal source and a load comprising the steps of:

selecting a second amplifying means that exhibits a non-linear signal response characteristic to an applied input signal similar to that of said first amplifying means;

applying a first portion of said input signal obtained from said signal source to said second amplifying means to generate an output signal therefrom;

determining whether there is any difference between a second portion of said input signal and said output signal and providing a difference signal in accordance therewith;

phase inverting said difference signal to obtain an inverted difference signal;

combining said inverted difference signal with said second portion of said input signal to obtain a corrected input signal;

applying said corrected input signal to said first amplifying means to obtain a corrected output signal therefrom;

delaying said second portion of said input signal for a time period corresponding with the time duration of any delay caused by said second amplifying means; and, varying the phase of said difference signal prior to inverting said difference signal.

23. A method of linearizing a first amplifying means having a non-linear signal response characteristic to an applied input signal and located between a signal source and a load comprising the steps of:

selecting a second amplifying means that exhibits a non-linear signal response characteristic to an applied input signal similar to that of said first amplifying means;

applying a first portion of said input signal obtained from said signal source to said second amplify means to generate an output signal therefrom;

determining whether there is any difference between a second portion of said input signal and said output signal and providing a difference signal in accordance therewith;

phase inverting said difference signal to obtain an inverted difference signal;

combining said inverted difference signal with said second portion of said input signal to obtain a corrected input signal;

applying said corrected input signal to said first amplifying means to obtain a corrected output signal therefrom; and, varying both the phase and magnitude of said output signal obtained from said second amplifying means prior to determining whether there is any difference between said second portion of said input signal and said output signal and varying both the magnitude and phase of said difference signal prior to inverting said difference signal.

24. Apparatus for linearizing a first amplifier having a non-linear signal response characteristic to an applied input signal and located between a signal source and a load, comprising:

a second amplifier selected such as to exhibit a non-linear signal response characteristic to an applied input signal similar to that of said first amplifier;

a first sampler that applies a first portion of said input signal obtained from said signal source to said second amplifier to generate an output signal therefrom;

a difference circuit that determines whether there is any difference between a second portion of said input signal and said output signal and providing a difference signal in accordance therewith;

a phase inverter that phase inverts said difference signal to obtain an inverted difference signal;

a combiner that combines said inverted difference signal with said second portion of said input signal to obtain a corrected input signal;

a second circuit that applies said corrected input signal to said first amplifier to obtain a corrected output signal therefrom;

a second sampler that applies portions of said input signal to said difference circuit and to said combiner.

25. Apparatus as set forth in claim 24 including a timer delayer that delays said second portion of said input signal for a time duration corresponding with a time delay caused by said second amplifier.

26. Apparatus as set forth in claim 25 wherein said time delayer is interposed between said first sampler and said difference circuit and in parallel relationship with said second amplifier.

27. Apparatus as set forth in claim 24 including a scaler interposed between said phase inverter and said combiner for scaling said inverted difference signal.

28. Apparatus as set forth in claim 24 including an attenuator interposed between said second amplifier and said difference circuit for attenuating said output signal.

29. Apparatus as set forth in claim 28 wherein said attenuator is adjustable.

30. Apparatus as set forth in claim 29 wherein said adjustable attenuator is manually adjustable.

31. Apparatus as set forth in claim 24 including a phase changer interposed between said second amplifier and said difference means for changing the phase of said output signal.

32. Apparatus as set forth in claim 31 wherein said phase changer is adjustable.

33. Apparatus as set forth in claim 32 wherein said adjustable phase changer is manually adjustable.

34. Apparatus as set forth in claim 24 including an attenuator interposed between said difference circuit and said phase inverter for attenuating said difference signal.

35. Apparatus as set forth in claim 34 wherein said attenuator is adjustable.

36. Apparatus as set forth in claim 35 wherein said adjustable attenuator is manually adjustable.

37. Apparatus as set forth in claim 24 including a phase adjuster interposed between said difference circuit and said phase inverter for adjusting the phase of said difference signal.

38. Apparatus as set forth in claim 37 wherein said phase adjuster is adjustable.

39. Apparatus as set forth in claim 37 wherein said phase adjuster is manually adjustable.

40. Apparatus as set forth in claim 24 including a first variable attenuator and a first variable phase adjuster interposed between said second amplifier and said difference circuit.

41. Apparatus as set forth in claim 40 including a second variable attenuator and a second variable phase adjuster interposed between said difference circuit and said phase inverter.

\* \* \* \* \*